United States Patent
Trassl et al.

(10) Patent No.: US 7,763,535 B2
(45) Date of Patent: Jul. 27, 2010

(54) METHOD FOR PRODUCING A METAL BACKSIDE CONTACT OF A SEMICONDUCTOR COMPONENT, IN PARTICULAR, A SOLAR CELL

(75) Inventors: Roland Trassl, Gießen (DE); Jian Liu, Großkrotzenburg (DE); Stephan Wieder, Frankfurt (DE); Jürgen Henrich, Limeshain (DE); Gerhard Rist, Langenselbold (DE)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 12/202,123

(22) Filed: Aug. 29, 2008

(65) Prior Publication Data
US 2009/0061627 A1 Mar. 5, 2009

Related U.S. Application Data

(60) Provisional application No. 60/968,949, filed on Aug. 30, 2007.

(51) Int. Cl.
*H01L 23/488* (2006.01)
(52) U.S. Cl. .............. 438/612; 438/678; 438/679; 257/E21.575
(58) Field of Classification Search .......... 438/647, 438/597, 584, 662, 678, 679, 680, 612; 257/E21.575
See application file for complete search history.

(56) References Cited

U.S. PATENT DOCUMENTS

| 4,451,972 | A | * | 6/1984 | Batinovich | 438/460 |
|---|---|---|---|---|---|
| 7,071,018 | B2 | | 7/2006 | Mason et al. | |
| 2003/0044539 | A1 | * | 3/2003 | Oswald | 427/404 |
| 2005/0056312 | A1 | * | 3/2005 | Young et al. | 136/258 |
| 2005/0073017 | A1 | | 4/2005 | Kim | |
| 2005/0074917 | A1 | * | 4/2005 | Mason et al. | 438/83 |
| 2006/0096635 | A1 | * | 5/2006 | Tuttle | 136/262 |
| 2006/0105103 | A1 | | 5/2006 | Hartig | |
| 2006/0130891 | A1 | | 6/2006 | Carlson | |
| 2006/0196414 | A1 | | 9/2006 | Schuhmacher et al. | |
| 2007/0048992 | A1 | | 3/2007 | Hosokawa et al. | |
| 2008/0035477 | A1 | | 2/2008 | Gawer et al. | |
| 2008/0213477 | A1 | * | 9/2008 | Zindel et al. | 427/255.28 |

FOREIGN PATENT DOCUMENTS

| DE | 10352143 | 6/2005 |
|---|---|---|
| EP | 1746182 | 1/2007 |
| JP | 3076165 | 4/1991 |
| KR | 20020057607 | 7/2002 |

* cited by examiner

*Primary Examiner*—Matthew Smith
*Assistant Examiner*—Michele Fan
(74) *Attorney, Agent, or Firm*—Patterson & Sheridan, L.L.P.

(57) ABSTRACT

The present invention relates to a method for manufacturing a backside contact of a semiconductor component, in particular, of a solar cell, comprising a metallic layer on the backside of a substrate in a vacuum treatment chamber, and the use of a vacuum treatment system for performing said method. Through this method and its use, in particular silicon based solar cells, can be provided with a back contact in a simple manner in a continuous process sequence, wherein the process sequence can be provided particularly efficient and economical, since no handling systems for rotating the substrate are required, and in particular silk screening steps can be dispensed with.

17 Claims, 1 Drawing Sheet

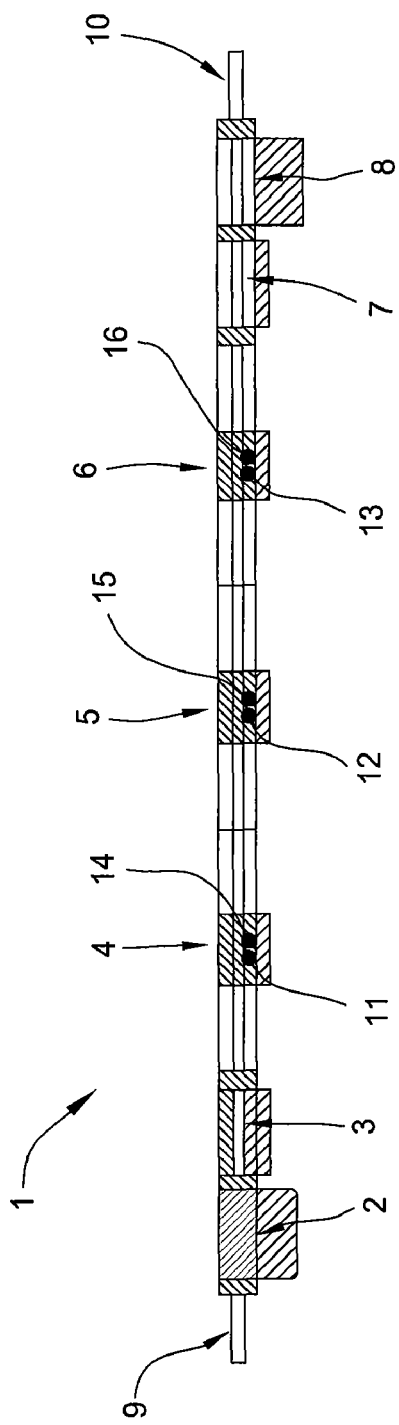
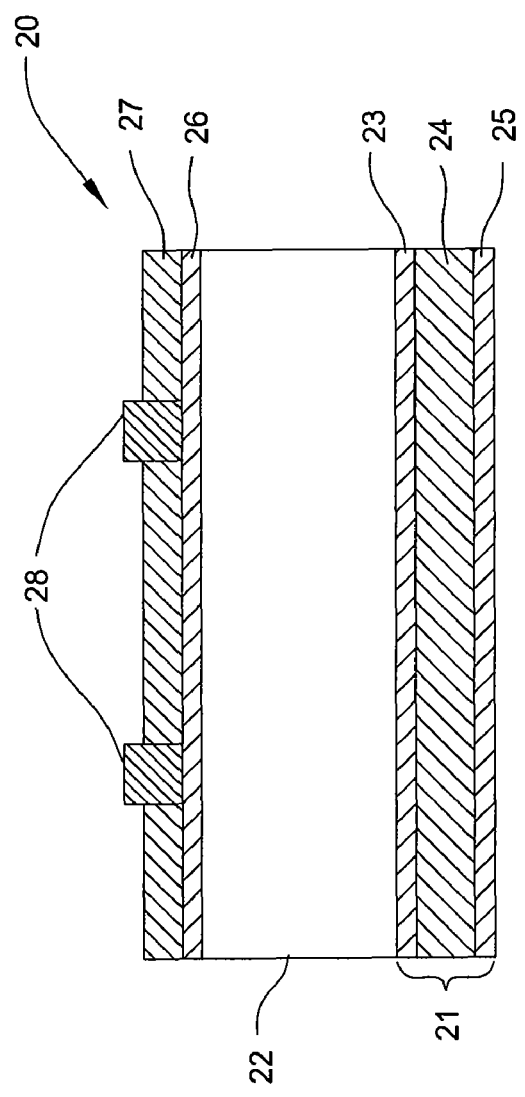

METHOD FOR PRODUCING A METAL BACKSIDE CONTACT OF A SEMICONDUCTOR COMPONENT, IN PARTICULAR, A SOLAR CELL

CROSS-REFERENCE TO RELATED APPLICATIONS

This application claims benefit of U.S. provisional patent application Ser. No. 60/968,949, filed Aug. 30, 2007, which is herein incorporated by reference.

BACKGROUND OF THE INVENTION

1. Field of the Invention

The present invention relates to a method for manufacturing a backside contact of a semiconductor element, in particular, a solar cell such as a silicon based solar cell wherein the backside contact comprises a metallic layer on the backside of a substrate and the semiconductor component may have further layers on the frontside and/or on the backside of the substrate. The present invention also relates to a vacuum treatment system for manufacturing a backside contact of a semiconductor element such as silicon based solar cell.

2. Description of the Related Art

Photovoltaic technology is of great interest, since its importance is believed to increase further, due to the desire to achieve an energy supply that is independent of fossil fuels. In spite of the fact that thin film solar cell technology has been researched at an increased pace lately, silicon technology still generates the largest revenues. The reason is not only that this technology is the most mature one, but also because the most efficient solar cells can be produced with it.

In the manufacture of a silicon solar cell, so far the following steps are being performed. In a first step, a damage repair and texturing of the silicon wafer is being performed. In a second step, the emitter is produced through indiffusion of a doping, e.g. of the phosphorus donator, which deposits approximately 0.5 µm below the surface of the silicon wafer, forming an emitter layer. Simultaneously with the manufacture of the emitter $SiO_2$ is created, which is removed again in a third step through etching. Thereafter, a SiN:H anti-reflection layer is deposited, which is performed through (PE)CVD (plasma enhanced) chemical vapor deposition, or through a reactive sputtering process. The SiN:H layer serves as a passivation layer, through the hydrogen diffusing into the silicon wafer in a subsequent firing step, or diffusing into the emitter layer, passivating voids. In a fourth step, contacts are deposited on the front side and on the backside of the wafer through silk screening by using a silver paste on the front side (the side with the emitter layer), and by using an aluminum paste on the backside as a metallic layer with cutouts, into which a silver paste is inserted as a layer that can be soldered. In a subsequent fifth layer, heating is performed (firing step), through which the contacts are hardened. Thereby, the silver is pressed through the SiN:H layer on the front side in the areas, in which it was deposited onto the SiN:H layer, and onto the silicon wafer, contacting it. As already described above, thereby a simultaneous passivation of the front side voids is performed through hydrogen indiffusion and deposition onto the voids. On the backside, a BSF (back surface field) is formed through the firing step, which also causes a passivation, thus of the voids on the backside. All this is performed through aluminum defusing into the silicon wafer, whereby an Al—Si— eutectic is formed. Eventually edge insulation can be effectuated for avoiding leakage currents, e.g. through breaking the wafers.

As previously described, the back contact of such a silicon solar cell is generally made from a metallic layer, and otherwise possibly comprises a barrier layer and a layer that can be soldered. Typically, the metallic layers of the backside contacts are currently manufactured through silk screening. Thereby, it is required for large scale application in vacuum treatment systems with continuous operation, which make the manufacture of such solar cells economical, and in which several substrates are coated simultaneously, to provide each single substrate separately with such a back contact. This means that for each single substrate a separate silk screening process has to be performed. Thereby, the throughput of such a vacuum treatment system is limited. Furthermore, special handling systems are required, in order to rotate the substrates, thereby the cost of such systems is increased and the throughput is further reduced.

Furthermore, it is a disadvantage of the backside contacts thus manufactured that the silk screening pastes, which are being used, are expensive, and the contact, which is being formed, is of poor quality, since the hardened layer is porous, and only this way a punctiform contact is present. For the metallic layer, a layer thickness of approximately 30 µm is required, whereby thin wafers can bend. This influence is gaining importance, since there is a desire to reduce the wafer thickness. The wafer thickness is thus determined as a tradeoff between cost and efficiency, wherein very thick wafers are expensive due to the material required, very thin wafers are expensive due to the complex manufacture, and the efficiency is, on the one hand, determined by a sufficiently large layer thickness for light absorption and, on the other hand, through a thickness that is small enough, so that losses due to charge carrier recombination are kept small. At present, wafer thicknesses of 200 µm to 250 µm are preferred, wherein a bending would have negative effects.

It is the object of the present invention to increase the efficiency of vacuum treatment systems in the manufacture of solar cells with metallic back contacts, and thus in particular to make a silk screening step redundant. Thus the manufacture shall be economical, in particular commercially viable, and shall be possible with a higher throughput than possible so far.

This object is accomplished through a method according to claim 1, and through the use of a vacuum deposition system for performing this method according to claim 17. Advantageous refinements of this object can be derived from the respective dependent claims.

For small batches of silicon solar cells, depositing the metallic layers in vacuum was already suggested by U.S. Pat. No. 7,071,081 B2. However, not in a inline vacuum deposition system, and exclusively for generating a BSF (back surface field), wherein initially a metallic layer made from aluminum is deposited through vapor deposition, or through sputter deposition, said layer is then sintered and deposited with a group V-element. These three process steps have to be performed in three different apparatuses. Therefore, also this deposition method can not be economically applied in vacuum deposition apparatuses with inline operation, and furthermore, the actual metal backside contact still has to be applied through silk screening.

From U.S. Pat. No. 7,071,018 B2, it is furthermore known that silicon solar cells have been realized on a lab scale, wherein an aluminum layer with a layer thickness of greater or equal 2 µm was deposited through PVD on a thin dielectric $SiO_2$ or SiN layer. The $SiO_2$— or SiN layer, on the one hand, facilitates the buildup of the BSF and, on the other hand, avoids a doping diffusion. This method, however, is not suited for a commercial, cost efficient production, since silicon wafers are necessary for this purpose, which are manufactured according to the floating zone method.

Through the method according to the invention, a silk screening step for depositing the backside contacts is not necessary any more, and the vacuum is not interrupted, so that an undesired oxide formation, and therefore the subsequent cleaning step are avoided.

SUMMARY OF THE INVENTION

The method according to the invention for manufacturing a backside contact of a solar cell with a metallic layer on the backside of a substrate is characterized in that the metallic layer is deposited through sputtering from a target, or through vapor deposition in an inline vacuum deposition system, and depositing at least one additional layer on at least one of a frontside or backside of the substrate in the inline vacuum deposition system, wherein the metallic layer and the additional layer are deposited without interrupting vacuum.

In another aspect of the invention, a vacuum treatment system includes at least one vacuum treatment chamber and at least two deposition tools configured for depositing a metallic layer on the backside of a substrate through sputtering or vapor deposition and depositing at least one additional layer on at least one of a frontside or backside of the substrate in the inline vacuum deposition system without interrupting the vacuum.

BRIEF DESCRIPTION OF THE DRAWINGS

The present invention is now explained in detail with reference to two embodiments with reference to the drawing, showing in:

FIG. 1 an inline vacuum deposition system for performing the method according to the invention; and FIG. 2 a solar cell produced with the process according to the invention.

DETAILED DESCRIPTION

When the deposition tools for depositing the backside contact are disposed with reference to the product flow of the line, opposed to the deposition tools for depositing the layers on the front side of the substrate, no complex handing systems are necessary for rotating the substrate. Therefore, the substrate does not have to be rotated any more, but it can be deposited from both sides. This way, the major part of the manufacturing process of a silicon solar cell can be performed in principle continuously in an inline vacuum deposition apparatus.

In order to avoid shading of the substrate through the carrier, it is provided in a useful manner, that the substrate rests in the carrier on substantially punctiform supports.

Thus, the substrate is preferably run along the coating tools substantially horizontally. This way, apparatuses, in which the deposition tools are aligned vertically with reference to their deposition direction, and in which a horizontal substrate transport is performed, can be used, whereby the handling of the substrate during the transport is simplified, since it can now be run e.g. over transport rollers.

In a particularly advantageous embodiment of the method, the metal layer comprises a material from the group of aluminum, silver, molybdenum and/or nickel, or a mixture of one or several of the preceding materials. These metals have very good contact properties, due to their electrical conductivity. Preferably, however, aluminum is to be used, since this material is low cost. The metal layer shall particularly be deposited with a thickness of 0.1 µm to 10 µm, preferably 2 µm. Such thin layers are sufficient, since the contact properties are much better, than with metallic layers, which have been deposited through a silk screening process. With these thin layers, there are also no problems with respect to a wafer bending, also with thin substrates.

Between the substrate and the metallic contact layer, a passivation layer, made from a material from the group Sin:H, SiC:H, $SiO_2$:H or a-Si:H, preferably SiN:H, is deposited. Furthermore, a barrier layer, e.g. made from WTi, can be provided in a useful manner. In order to improve the soldering capabilities of the metallic contact layer, a layer that can be soldered is deposited onto this layer in a useful manner. Said layer can have one or several layers from materials from the group silver (Ag), nickel (Ni), nickel vanadium alloy (NiV), nickel chromium alloy (NiCr), and chromium (Cr). Layers, in this context, comprise also embodiments, in which there is no closed surface layer. The layer that can be soldered can e.g. also be provided structured, this means only partially covering the surface.

These additional layers are then also being deposited by the process according to the invention, wherein vapor deposition and also sputtering deposition are possible however, sputtering deposition is being preferred.

In a preferred embodiment, the contacting of the metallic layer on the backside of the substrate is performed with the substrate through partial melting through an intense laser beam, so that a laser fired contact (LFC) is created. This method can also be advantageously applied when a passivation layer is present on the backside between the substrate and the metallic layer.

In a particularly preferred manner, at least one layer is deposited on the front side of the substrate during the deposition of at least one layer on the backside of the substrate. Therefore, opposing deposition tools are disposed in at least one vacuum treatment chamber of the vacuum treatment apparatus, wherein the substrate is moved between the deposition tools. Through the substrate, thus two separate areas of the chamber are defined. Thereby, the physical volumetric size, and thus the cost of such a vacuum treatment apparatus can be lowered, and throughput can be increased at the same time, since two layers are deposited on a substrate simultaneously.

It certainly has to be assured in this embodiment, that the deposition processes do not influence or impede each other. Thus e.g. several metals can be vapor deposited simultaneously, when the metals do not influence each other. Also, identical layers can be sputtered on, since the process gases and the layer materials then do not influence each other. However, layers cannot be vapor deposited, or sputtered on simultaneously, since the process gas pressures are too different at $10^{-4}$ mbar or $10^{-3}$ mbar.

With respect to the present invention, "inline processing" does not necessarily mean a physical transportation of the substrate from a vacuum chamber to the other, in order to deposit various layers, but also a passing through particular process steps without physical transportation of the substrate, this means the simultaneous deposition of layers on the front- or backside of the substrate. Put differently, "inline" also means that the substrate in the vacuum treatment apparatus is transported into a vacuum treatment chamber, rests in a position therein, and leaves the vacuum chamber and possibly the vacuum apparatus again, after the coating on the front- and on the backside has been effected. Certainly, the substrate can also be transported during the coating process.

The throughput can be increased additionally, when several substrates, which are located in particular in a common carrier are simultaneously provided with the metallic layer.

In order to simplify the maintenance of the apparatus, at least one coating tool can be provided in a drawer of the vacuum treatment chamber. In a drawer means in this context that after removal of the respective drawer no interruption of the vacuum of the process occurs, but substrates can still be transported through the respective vacuum chamber in vacuum. The transport area of such a vacuum treatment chamber can thus be separated from the inserts with respect to the vacuum.

When the one layer of the metallic layer is vapor deposited, the metal can preferably be provided as a wire to the evaporator through a vacuum passage.

On the other hand, also the following steps can be used, when vapor depositing the metal: evaporators of the metal are provided into subsequent vacuum treatment chambers, and the metal is evaporated in a vacuum treatment chamber until the metal in the first evaporator included therein is consumed. When the metal in the first evaporator is consumed, the metal in the other vacuum treatment chamber is evaporated with a second evaporator, without interrupting the vapor deposition. Then, in particular the first evaporator can be maintained, when it is provided in a drawer, and subsequently, after the second evaporator is consumed, the first evaporator can continue evaporation and so on. Thereby, the throughput is increased, since metal can be evaporated this way without interrupting the deposition process.

When a sputter deposition is performed instead of a vapor deposition, the metal contact layer can preferably be sputter deposited with at least one rotatable cathode each. With such a rotatable cathode, much more constant deposition conditions are created long-term, than e.g. with static planar cathodes. In particular, thereby, the deposition is to be performed in a DC-sputter process, wherein also pulsated DC-sputtering or MF-sputtering (medium frequency sputtering of at least two targets) is possible, and can be performed in particular dynamically, this means during simultaneous substrate transport.

In an advantageous embodiment, the number of cathodes is selected depending on the sputter yield of the cathodes, the thickness of the metallic layer to be reached, and the throughput of the vacuum treatment apparatus to be accomplished. This means that with a predetermined layer thickness, sputter yield and throughput, the number of cathodes is adapted. Certainly, simultaneously, also through adjustment of the sputtering conditions, the sputter yield and/or through adjustment of the transport velocity the throughput can also be adapted.

Also the barrier layer and the layer that can be soldered can be deposited with these vapor depositions- or sputtering techniques. The passivation layer however, is only deposited through sputtering.

The use of a vacuum treatment apparatus with at least one vacuum treatment chamber is claimed independently, wherein the vacuum treatment apparatus comprises at least two coating tools for performing the above described process.

It is preferred, when the vacuum treatment apparatus has a substantially horizontal transport path, wherein the deposition device and the deposition tools are aligned vertically. Suitable are e.g. vacuum deposition apparatus as they are described in the Patent documents DE 103 52 143 A1 and DE 103 52 144 A1, wherein these Patent documents and the vacuum deposition apparatus are incorporated in the disclosure of the present invention in their entirety by reference.

It is advantageous in particular, when the vacuum treatment apparatus comprises at least one drawer element, which can be inserted into the interior of at least one vacuum treatment chamber, or can be pulled out of the interior, wherein the coating tools are disposed at the insert elements. This way, a modular system is provided for the method, in which the processing times are minimized, since the coating tools can be replaced or maintained in a particularly simple manner. In particular, when e.g. for the vapor deposition, as described above, two evaporators are being operated alternatively, which are disposed in subsequent vacuum treatment chambers in such insertable elements, processing times with respect to this coating tool can be avoided entirely.

Respective vacuum pretreatment apparatus are known from EP 1 698 715 A1, wherein this document and the vacuum treatment systems shown therein are incorporated in their entirety into the disclosure of the present invention by reference.

In a particularly preferred manner, at least one vacuum treatment chamber of the system comprises at least two deposition tools, wherein a first deposition tool points to the front side of one or several substrates to be coated in the vacuum treatment system, and a second one points to the backside. This way, the length of the system, and thus its cost and its throughput can be optimized as described above. In an advantageous manner, thus at least one insertion element has two deposition tools, which point to the front- and the backside of the substrates respectively. Thus, the system length can be shortened even more, and both deposition tools can be taken out and maintained simultaneously through the one insertable element.

For particularly simplified handling, it can be provided that the vacuum treatment system has transport rollers, on which the substrate(s) or a carrier for several substrates can be transported through the vacuum treatment system.

FIG. 1 shows a horizontal inline vacuum deposition system 1 in a purely schematic manner. This system 1 is divided into several vacuum deposition chambers 2, 3, 4, 5, 6, 7, 8, and a loading area 9 and an unloading area 10, and it has a substrate transport system disposed in a horizontal plane (not shown), which is realized through transport rollers, which are driven mechanically, in order to transport substrates (not shown) located in carriers (not shown) on the transport rollers along the extension of the system 1, through the particular subsequent vacuum chambers 2, 3, 4, 5, 6, 7, 8.

The vacuum chambers 4, 5, 6 provided for coating have insertion elements 11, 12, 13, on which the deposition tools 14, 15, 16, associated with a chamber are disposed. Furthermore, particular vacuum pumps (not shown) are associated with each deposition chamber, typically turbo molecular pumps. Sputter sources, as e.g. sputter cathodes and magnetrons, but also thermal evaporators, and similar, are suited for use as deposition tools. Providing such insertable elements 11, 12, 13 allows a quick maintenance and a speedy replacement of the respective coating tools.

Single or plural silicon substrates, received in a carrier, are now subsequently inducted on the transport rollers, and continuously move through the particular chambers 2, 3, 4, 5, 6, 7, 8 and subsequently provided with the layers necessary for a solar cell. Certainly, also a discontinuous transport is possible, when the substrates are thus not transported during the coating process.

Thus, the deposition of those layers is performed, which are to be located on the front side of a substrate, through deposition tools which are located above the transport path of the substrates, thus pointing vertically downward. When these layers are deposited through sputtering, this deposition is thus performed in the so-called "sputter-down" mode. The embodiment according to FIG. 1, however, only shows the manufacture of the backside contact. The metallic layer for the backside contact of the solar cell is in turn deposited through deposition tools 14, 15, 16, which are disposed below the transport path of the substrates, thus facing vertically upwards. When these layers are deposited through sputtering, this deposition is thus performed in the so-called "sputter-up" mode.

In order to reduce the longitudinal extension of the system and in order to increase the throughput simultaneously, it can be provided that in those chambers, in which deposition tools for depositing the backside contact are provided simultaneously, also deposition tools for depositing layers on the front side are provided (not shown). However, as mentioned above, it has to be assured here that the two deposition processes do not influence or impede each other. For example, the creation of the SiN:H layers on the front or backside of a substrate can be performed simultaneously. Both deposition tools of such a chamber are then disposed at a respective insertable element, and can thus be replaced and maintained. When sputter sources are in turn provided as deposition tools, then consequently in a chamber a "sputter-down" and a "sputter-up" process are performed simultaneously. For a continuous substrate transport, the deposition rates of the two deposition tools have to be adjusted, so that the respective desired layer thickness is achieved dynamically on both sides with reference to the said transportation velocity of the substrates on the transport rollers. Simultaneously, also the deposition rates of the deposition tools of the other chambers are adapted, so that the substrate(s) can be constantly transported along the entire transport path within the system. This adjustment of the deposition rates is not required in case of a discontinuous transport.

The deposition process of a silicon substrate inducted into the system with reference to the backside contact is performed during the manufacture of a silicon solar cell, so that in the "sputter-up" process one or several rotation cathodes 14, 15, 16 dynamically deposit a passivation layer, the metallic contact layer, possibly a barrier layer (not shown), and eventually, for improvement of the soldering capability of the backside contact, a solderable layer on the backside of the silicon substrate, in subsequent chambers 4, 5, 6. The number of the rotation cathodes 14, 15, 16 per coating chamber thus depends on the deposition rate, the desired layer thickness and the desired throughput, thus the transportation velocity of the system. In an alternative embodiment (not shown), the system is provided substantially like in the first embodiment, wherein the deposition tool for depositing the metallic layer and/or the barrier layer and/or the layer that can be soldered, is no sputter source, but a thermal evaporator. This thermal evaporator is disposed in a insertable element, and provides for a coating of the substrate backside. Thus the metal can be provided to the evaporator, either as a wire sealed from the atmosphere through vacuum pass-throughs or, as it is preferred, two respective evaporators are provided in subsequent chambers in one insertable element each. When the material of an evaporator is consumed, which typically occurs after 24 hours of operation, a horizontal valve is moved over the respective insertable element, separating it from the transport volume, in which the substrate moves. Simultaneously, the deposition process starts with the other evaporator in the adjacent chamber. The insertable element separated by the valve can be vented now and removed, so that the empty evaporator disposed therein can be equipped with fresh material.

The passivation layer is thus deposited again in a "sputter-up" process through one or several rotation cathodes. Also the barrier layer and the layer that can be soldered can be sputtered on, instead of vapor deposited, so that only the metallic layer is vapor deposited.

A solar cell 20 manufactured through the method according to the invention has a backside contact 21 according to FIG. 2, which is constructed as a laminate system on the substrate backside of a silicon substrate 22, and has the sequence: passivation layer 23, metallic contact layer 24, and solderable layer 25. The passivation layer is comprised of SiN:H, SiC:H, SiO$_2$:H or a-Si:H. The metallic layer comprises a material from the group aluminum, silver, molybdenum, and/or nickel and it is preferably made from aluminum. The passivation layer 23 is preferably made from SiN:H, and the metallic layer 24 is preferably made from aluminum. Between the solderable layer 25 and the metal layer 24, a barrier layer can possibly be provided (not shown), which is e.g. made from WTi. The solderable layer comprises one or several layers of materials from the group Ag, Ni, NiV, NiCr, and Cr, e.g. a layer sequence of Ag/NiV and is preferably made from silver. After depositing the metallic layer 24, a LFC-step can be provided, in which the metallic layer 24 is contacted with the substrate 22 at certain points, through laser induced melting, and a laser fired contact is thereby formed.

The choice to vapor deposit or sputter the metallic aluminum contact layer 24 depends on the actually required layer thicknesses, and the deposition rates of the sputtering tools. When e.g. LFC-contacts (laser fired contacts) are to be produced, layer thicknesses of a few μm are required, for which vapor deposition is being used. For thinner layers with less than 1 μm, on the one hand, sputtering is being used. Therefore, preferably also the barrier layer, and the solderable layer 25 are sputtered, since they have a thickness of less than 1 μm.

Furthermore, the solar cell 20 has an emitter layer 26, which was created by indiffusion of doping materials, e.g. phosphorus, a SiN:H-passivation layer 27, and bar shaped front contacts 28, made from silver. The deposition of these layers could also be integrated into the process sequence of the inline vacuum deposition system 1.

Through the above descriptions it has become apparent that through the method according to the invention, and through the use of a vacuum treatment system, according to the invention, in particular solar cells on a silicon basis can be provided with a metallic layer for a backside contact in a simple manner, wherein the process sequence can be provided particularly efficient (high throughput), and economical, since silk screening steps can be dispensed with, and thus no interruption of the vacuum is necessary. Furthermore, the wafer fracture rate can be reduced, since the wafer handling is reduced.

Though only a solar cell was described for the invention in detail, it is evident, that the invention can also be applied to backside contacts of other semiconductor elements in an advantageous manner.

The invention claimed is:

1. A method for producing a backside contact of a semiconductor element, comprising:
   depositing a metallic layer on the backside of a substrate through sputtering or vapor deposition in an inline vacuum deposition system having deposition tools; and
   depositing at least one additional layer on at least one of a frontside or backside of the substrate in the inline vacuum deposition system, wherein the metallic layer and the additional layer are deposited without interrupting vacuum, wherein the at least one additional layer is a solderable layer comprising one or several layers of material chosen from the group consisting of Ag, Ni, NiV, NiCr, or Cr and is deposited on the backside after depositing the metallic layer.

2. The method according to claim 1, wherein the deposition tools for depositing the layers on the backside of the substrate are disposed with reference to a product flow path of the vacuum deposition system, opposite to the deposition tools for depositing the layers on the frontside of the substrate, wherein the substrate rests in particular on punctiform supports of a carrier in order to substantially avoid a shadowing of the substrate through the carrier.

3. The method according to claim 1, wherein the substrate is substantially moved in a horizontal path along the deposition tools, so that the deposition direction is vertical.

4. The method according to claim 1, wherein the metallic layer comprises a material chosen from the group consisting of aluminum, silver, molybdenum, nickel, or combinations thereof, wherein the metallic layer is deposited with a thickness of 0.1 µm to 10 µm.

5. The method according to claim 1, wherein a passivation layer comprising a material chosen from the group SiN:H, SiC:H, SiO$_2$:H, or a-Si:H is deposited before depositing the metallic layer.

6. The method according to claim 1, wherein after depositing the metallic layer, the metallic layer is partially melted through an intense laser beam, so that a laser fired contact (LFC) is formed.

7. The method according to claim 1, wherein a barrier layer is deposited on the backside after depositing the metallic layer.

8. The method according to claims 7, wherein the solderable layer is deposited after depositing the barrier layer.

9. The method according to claim 7, wherein the barrier layer comprises WTi.

10. The method according to claim 1, wherein a layer is deposited on the frontside of the substrate during the deposition of a layer on the backside of the substrate.

11. The method according to claim 1, wherein several substrates are disposed in a common carrier and simultaneously provided with at least one layer.

12. The method according to claim 1, wherein at least one deposition tool is provided in a vacuum treatment chamber in an insertable element shaped as a drawer.

13. The method according to claim 1, wherein at least two coating tools are provided in a vacuum treatment chamber in an insertable element shaped as a drawer, wherein a first deposition tool points to the frontside and a second deposition tool points to the backside of the substrate.

14. The method according to claim 1, wherein at least one of the layers are vapor deposited, wherein the respective materials are provided as a wire through a vacuum passthrough into an evaporator.

15. The method according to claim 1, wherein at least one of the layers' materials is evaporated in a first and a second evaporator within two subsequent vacuum treatment chambers, where the materials are evaporated in the first evaporator until the material in the first evaporator is consumed and the materials are then evaporated in the second evaporator without interruption of the vapor deposition in the other vacuum treatment chambers of the inline vacuum deposition system.

16. The method according to claim 1, wherein at least one of the layers is sputtered on by at least one rotatable cathode.

17. The method according to claim 16, wherein the number of cathodes is selected depending on the sputter yield of the cathodes, the thickness of the layer to be achieved, and the throughput of the vacuum treatment system to be achieved.

\* \* \* \* \*